US009866208B2

(12) United States Patent
Wyland

(10) Patent No.: US 9,866,208 B2
(45) Date of Patent: Jan. 9, 2018

(54) PRECISION MEASUREMENTS AND CALIBRATIONS FOR TIMING GENERATORS

(71) Applicant: MICROSOFT TECHNOLOGY LICENSING, LLC, Redmond, WA (US)

(72) Inventor: David Wyland, Morgan Hill, CA (US)

(73) Assignee: MICROSOFT TECHNOLOGY LINCENSING, LLC, Redmond, WA (US)

( * ) Notice: Subject to any disclaimer, the term of this patent is extended or adjusted under 35 U.S.C. 154(b) by 278 days.

(21) Appl. No.: 14/740,017

(22) Filed: Jun. 15, 2015

(65) Prior Publication Data

US 2016/0365846 A1    Dec. 15, 2016

(51) Int. Cl.
    H03K 5/156    (2006.01)
    G01S 7/497    (2006.01)
    G01S 17/10    (2006.01)

(52) U.S. Cl.
    CPC ........... *H03K 5/1565* (2013.01); *G01S 7/497* (2013.01); *G01S 17/105* (2013.01)

(58) Field of Classification Search
    CPC ...... H03K 5/1565; G01S 7/497; G01S 17/015
    See application file for complete search history.

(56) References Cited

U.S. PATENT DOCUMENTS 6,104,223 A    8/2000  Chapman et al.
6,330,197 B1  12/2001  Currin et al.
6,959,016 B1  10/2005  Keeth et al.
7,027,945 B2   4/2006  Kelly
7,184,908 B2   2/2007  Mori
7,423,937 B2   9/2008  Bolli et al.
7,996,168 B2   8/2011  Kushnick
8,283,933 B2  10/2012  Dasnurkar
8,669,794 B2   3/2014  Park et al.
(Continued)

OTHER PUBLICATIONS

Response to International Search Report and Written Opinion filed Oct. 5, 2015 in International Patent Application No. PCT/US2016/032947.
(Continued)

*Primary Examiner* — Eric Bolda
(74) *Attorney, Agent, or Firm* — Jacob P. Rohwer; Newport IP, LLC

(57) ABSTRACT

Described herein are methods and subsystems for use with a timing generator having an output driver at which a timing signal having timing pulses is output. A method includes controlling the timing generator to cause the output driver to output a timing signal having an expected duty cycle, and filtering the timing signal to produce a DC voltage having a magnitude indicative of an actual duty cycle of the timing signal. The method also includes converting the DC voltage to a digital value indicative of the actual duty cycle of the timing signal. The method can also include comparing the digital value to an expected value corresponding to the expected duty cycle, and using results of the comparing to determine an error associated with the timing generator and/or produce a calibration table that can be used to calibrate the timing generator and/or calibrate a measurement made using the timing generator.

20 Claims, 7 Drawing Sheets

(56) References Cited

U.S. PATENT DOCUMENTS

| | | | | |
|---|---|---|---|---|
| 2004/0135992 | A1* | 7/2004 | Munro | G01S 17/10 356/4.01 |
| 2005/0246141 | A1 | 11/2005 | Hsu et al. | |
| 2009/0177457 | A1 | 7/2009 | Dai et al. | |
| 2010/0130139 | A1 | 5/2010 | Panikkath et al. | |
| 2012/0280732 | A1 | 11/2012 | Roytman et al. | |
| 2013/0258312 | A1* | 10/2013 | Lewis | G01S 7/4865 356/4.01 |
| 2014/0002170 | A1 | 1/2014 | Miyanishi et al. | |
| 2014/0184857 | A1 | 7/2014 | Stokes et al. | |
| 2014/0312233 | A1* | 10/2014 | Mark | G01J 1/46 250/341.8 |
| 2014/0320187 | A1 | 10/2014 | Inagawa | |
| 2014/0362364 | A1* | 12/2014 | Waligorski | G01S 17/36 356/5.01 |
| 2015/0041625 | A1 | 2/2015 | Dutton et al. | |

OTHER PUBLICATIONS

International Search Report and Written Opinion dated Aug. 22, 2016 in International Patent Application No. PCT/US2016/032947.

Dudek, et al., "A High-Resolution CMOS Time-to-Digital Converter Utilizing a Vernier Delay Line", In Proceedings of IEEE Transactions on Solid-State Circuits, vol. 35, No. 2, Feb. 2000, pp. 240-247.

Nagaraj, et al., "A Self-Calibrating Sub-Picosecond Resolution Digital-to-Time Converter", In Proceedings of IEEE/MTT-S International Microwave Symposium, Jun. 3, 2007, pp. 2201-2204.

Kalisz, Jozef., "Review of Methods for time Interval Measurements with Picosecond Resolution", In Proceedings of Metrologia, vol. 41, No. 1, Feb. 2004, pp. 17-32.

Levine, et al., "A High-Resolution Flash Time-to-Digital Converter and Calibration Scheme", In Proceedings of International Test Conference, Oct. 26, 2004, pp. 1148-1157.

Abas, et al., "Design of Sub-10-Picoseconds On-Chip Time Measurement Circuit", In Proceedings of the conference on Design, automation and test in Europe, vol. 2, Feb. 16, 2004, 6 pages.

Junnarkar, et al., "FPGA based Self Calibrating 40 Picosecond Resolution, wide range Time to Digital Converters", In Proceedings of the Nuclear Science Symposium Conference Record, Oct. 19, 2008, pp. 3434-3439.

Alter, "Using PWM Output as a Digital-to-Analog Converter on a TMS320F280x Digital Signal Controller", Texas Instruments Application report, SPRAA88A—Sep. 2008.

Written Opinion dated May 12, 2017, in International Patent Application No. PCT/US2016/032947.

International Preliminary Report on Patentability dated Sep. 12, 2017, in PCT Application No. PCT/US2016/032947.

* cited by examiner

PRECISION MEASUREMENTS AND CALIBRATIONS FOR TIMING GENERATORS

BACKGROUND

Many electronic devices and systems, such as devices and systems that determine distances to an object based on an optical time-of-flight (TOF) measurements, rely on precise timing signals (e.g., having picoseconds of resolution) from timing generators. In order to test the precision and/or accuracy of such timing generators and/or calibrate such timing generators, it would be useful to measure the precision and/or accuracy of timing signals produced by the timing generators. However, the equipment that is typically used to make such measurements is typically relatively large in size compared to the electronic devices and systems, which makes such measurements difficult and expensive and adds complications during calibrations.

SUMMARY

Embodiments of the present technology relate to methods and subsystems for use with a timing generator having an output driver at which a timing signal having timing pulses is output. A method, according to an embodiment, includes controlling the timing generator to cause the output driver to output a timing signal having an expected duty cycle, and filtering the timing signal to produce a DC voltage having a magnitude indicative of an actual duty cycle of the timing signal. The method also includes converting the DC voltage to a digital value indicative of the actual duty cycle of the timing signal. The method can also include comparing the digital value to an expected value corresponding to the expected duty cycle, and using results of the comparing to determine an error associated with the timing generator and/or produce a calibration table that can be used to calibrate the timing generator and/or calibrate a measurement made using the timing generator.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DETAILED DESCRIPTION

Before providing details of embodiments of the present technology, it is first useful to describe of an exemplary system with which embodiments of the present technology can be used. More specifically, FIG. 1 will be used to describe an exemplary system that includes a timing generator whose timing signal outputs, which including timing pulses, can be precisely measured using embodiments of the present technology. Such measurements can be made during the design of the exemplary system, e.g., to determine whether the system satisfies design requirements. Additionally, or alternatively, such measurements can be made and used during testing of the exemplary system, to determine whether the system satisfies system or device requirements. Additionally, or alternatively, such measurements can be used during a calibration procedure, which can be manual, automatic, or a combination thereof. Such a calibration procedure can be used, e.g., to generate a calibration table and/or to calibrate measurements made using the timing generator.

Figure 1:
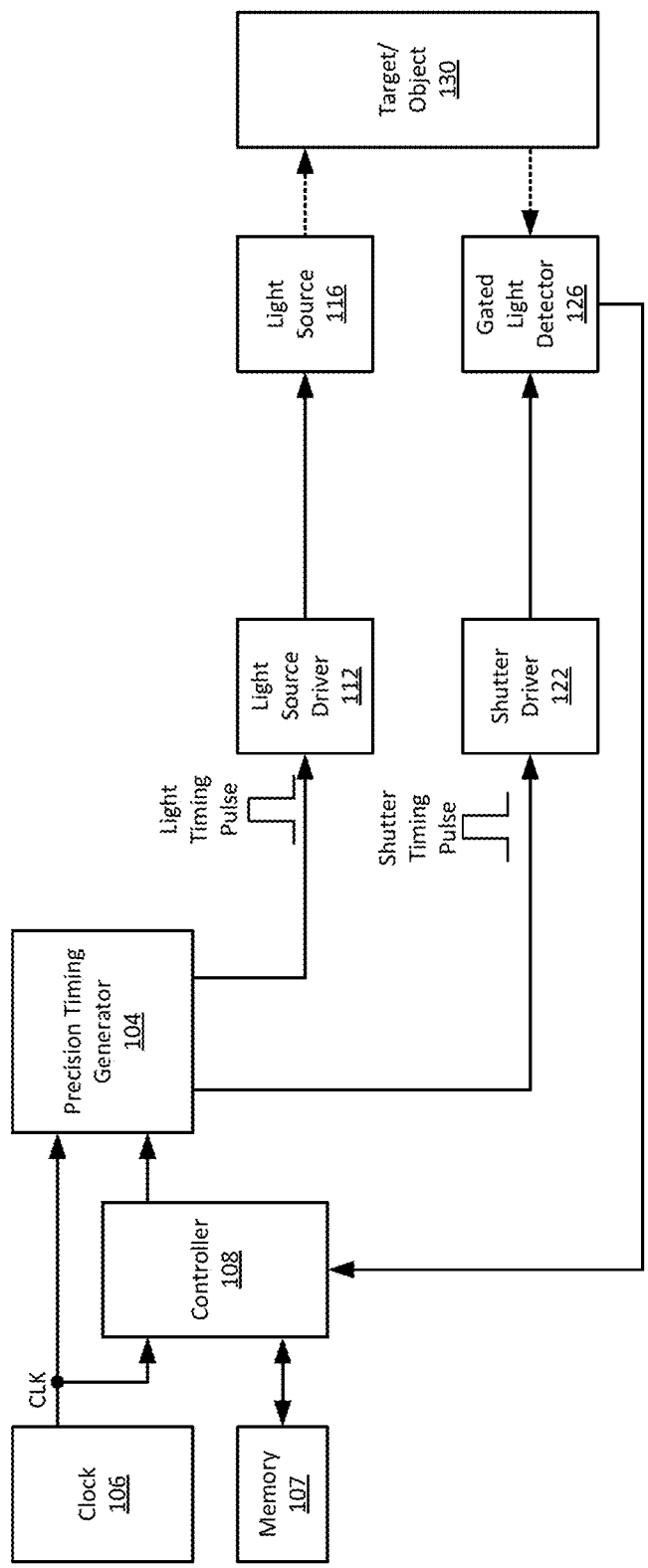
FIG. 1 illustrates an exemplary system that includes a timing generator whose timing signal outputs can be precisely measured using embodiments of the present technology.

FIG. 1 illustrates a system 102 that can produce time-of-flight (TOF) measurements, and in dependence on the TOF measurements, can detect the distance to an object, wherein the object is represented by a block 130. Referring to FIG. 1, the system 102 is shown as including a precision timing generator 104, a clock 106, memory 107, a controller 108, a light source driver 112 and a light source 116. The system 102 is also shown as including a shutter driver 122 and a gated light detector 126. The controller 108 can be implemented by a microprocessor, a microcontroller or a digital signal processor, but is not limited thereto. The system 202 can be used, e.g., in a mobile device to determine distances between the mobile device and one or more objects and/or to produce depth images for use by the mobile device. The mobile device can be, e.g., a mobile phone, a robot, a vehicle, a drone, a portable computer or a mixed reality head mounted display (HMD), but is not limited thereto. The system 102 can also be used, e.g., in a gaming system or any other computing device to determine distances between the system/device and one or more objects and/or to produce depth images for use by the system/device.

The light source 116 can be a laser diode, or a light emitting diode, but is not limited thereto. Where the light source 116 is a laser diode, the laser diode can be, e.g., an edge emitting laser diode or an array of vertical-cavity surface-emitting lasers (VCSELs). While it is likely that the light source 116 emits (also referred to as radiates) near infrared (NIR) or infrared (IR) light pulses, light pulses of other wavelengths of light can alternatively be emitted.

The gated light detector 126 can include a photosensitive surface of a semiconductor device such as Charge Coupled Device (CCD) or a Complementary Metal-Oxide-Silicon (CMOS) light sensitive device, having one or more light sensitive pixels formed on a silicon or other suitable substrate. A shutter, which is used to shutter (also referred to as gate) the photosensitive surface on or off (also referred to as open or closed) may comprise, by way of example, a gated image intensifier, or a solid state electro-optical or acousto-optical modulator, but is not limited thereto. For a more specific example, the gated light detector 126 can include an array of hundreds or thousands of light sensitive pixels that are used to obtain TOF depth images of an object, represented by the block 130 in FIG. 1. In such a case, the gated light detector 126 can be considered part of a gated TOF depth camera. Shuttering a TOF depth camera open or closed is also commonly referred to as "gating" a camera open or closed (hence the name "gated time-of-flight 3D camera") and refers to respectively enabling or preventing registration by the camera's photosurface of light collected by the camera. Gating a camera open or closed is also referred to herein as respectively gating open or gating closed its photosurface. Terms "gating on" and "gating off" a camera or a camera's photosurface are also used herein and respectively mean gating open and gating closed the photosurface or camera. "Shuttering" or "gating" a photosurface or camera without modification by the adverb "open" or "closed" refers to an operation of gating on and/or gating off the photosurface or camera.

A period of time during which a TOF depth camera is gated open is an exposure period during which the camera's photosurface registers light that the camera collects and directs to the camera's photosurface. A photosurface registers light by accumulating and storing charge, hereinafter "photocharge", which the light generates in the photosurface's pixels. The light generates photocharge by creating electron-hole pairs in the photosurface pixels. Depending on a doping configuration of the photosurface, the accumulated and stored photocharge may be either electrons or holes from the electron-hole pairs.

To image a scene and determine distances from the camera to features in the scene, the scene can be illuminated, for example with a train of light pulses (also referred to as a burst of light sources) emitted by the light source 116. Typically, the emitted (also referred to as radiated) light pulses are infrared (IR) or near infrared (NIR) light pulses, as mentioned above. The camera is gated open for an exposure period for each radiated light pulse in the train, following a predetermined delay from a time at which the light pulse is radiated. For a feature imaged on a pixel in the photosurface, light reflected by the feature from each radiated light pulse is registered on a pixel imaging the feature if the reflected light reaches the camera (and more specifically, the gated light detector 126) during the exposure period following the light pulse.

Following a last light pulse in the light pulse train, charges accumulated in the pixels of the photosurface during the exposure periods can be sensed and converted to voltages. The set of voltages representing the accumulated charges is referred to as a "frame" of the photosurface. Since the time elapsed between radiating a light pulse and the exposure period that follows it is known, a time it took imaged light that is registered by the pixels to travel from the light source to the reflecting features and back to the camera (and more specifically, the gated light detector 126) is known. Light registered by the pixels, the speed of light and the time elapsed is used to determine distances to features in the scene.

The controller 108 can calculate distances between an object (e.g., 130) and the system 102. Where the gated light detector 126 includes an array (e.g., of hundreds or thousands) of light sensitive pixels, the controller 108 can obtain a distance or depth value for each of the pixels, which can collectively be used to obtain TOF depth images of the object, or more generally of a scene that include one or more objects. The portion of the controller 108 that determines such distances or depths can be referred to as a distance calculator or a depth calculator. It is also possible that the distance calculator or depth calculator is implemented external to the controller 108. As noted above, the controller 108 can be implemented by a microprocessor, a microcontroller or a digital signal processor, but is not limited thereto. Where a distance calculator or a depth calculator is external to the controller 108, such a calculator can be implemented by a microprocessor, a microcontroller or a digital signal processor, but is not limited thereto. More generally, the controller 108, or a further controller, produces time-of-flight (TOF) measurements in dependence on detected pulses of light that are incident on the photosurface of the gated light detector 126 while the photosurface is shuttered on.

Where TOF depth images are produced, each depth image may include a two-dimensional (2-D) or three-dimensional (3-D) pixel area of a captured scene where each pixel in the 2-D or 3-D pixel area may represent a depth value such as a distance in, for example, centimeters, millimeters, or the like of an object in the captured scene from the camera. In certain embodiments, a depth image can specify, for each of the pixels in the depth image, a pixel location and a pixel depth.

Still referring to FIG. 1, the precision timing generator 104 is shown as receiving a clock (CLK) signal from a clock 106 being controlled by the controller 108. The CLK signal can be, e.g., a 45 MHz clock signal, but is not limited thereto. The memory 107 can store instructions that are used by the controller 108 to control the timing of signals produced by the precision timing generator 104. The memory 107 can additionally store TOF measurements and/or depth images. These are just a few examples of the type of information that can be stored in the memory 107, which is not intended to be all encompassing.

In accordance with an embodiment, the controller 108 controls the precision timing generator 104 to output a timing signal (including timing pulses) that is used to control the timing of light pulses emitted by the system 102, in which case, the timing signal can be referring to as a light timing signal and the pulses thereof can be referred to light timing pulses. The light timing pulses (of the light timing signal) produced by precision timing generator 104 are provided to the light source driver 112 and are used by the light source driver 112 to produce light drive pulses that drive the light source 116 to emit pulses of light. Explained another way, the light source driver 112 converts light timing pulses to light drive pulses having the appropriate current, and more generally the appropriate power, required to drive the light source 116. Where the light source 116 is a laser or laser diode, the light source driver 112 can be referred to more specifically as a laser driver or a laser diode driver.

In accordance with an embodiment, the system 102 can be configured to cause the light source 116 to emit a burst of pulses (also referred to as a train of pulses) multiple (e.g., 30) times per second. In other words, where the system 102 is part of a TOF depth camera, the TOF depth camera can have a frame rate of 30 frames per second. Each of the bursts of pulses can include, e.g., 10,000 pulses, with each of the pulses in a burst being approximately 6 ns in width, and each of the pulses in the burst being spaced apart from one another by about 200 ns. These are just examples, which are not meant to be limiting.

In accordance with an embodiment, the controller 108 controls the precision timing generator 104 to output a shutter timing signal (including shutter timing pulses) that is used to control the shuttering of the gated light detector 126. The frequency at which the gated light detector 126 is gated or shuttered can be the same as or similar to the frequency at which the light source 116 is driven to emit of pulses of lights, but that need not be the case. The shutter timing pulses (of the shutter timing signal) produced by precision timing generator 104 are provided to the shutter driver 122 and are used by the shutter driver 122 to produce shutter drive pulses that drive the gated light detector 126. Explained another way, the shutter driver 122 converts shutter timing pulses to shutter drive pulses having the appropriate current, and more generally the appropriate power, required to drive the gated light detector 126.

The above described system 102 can determine distances to an object (e.g., 130) based on an optical time-of-flight (TOF) measurements. More specifically, a pulse of light is emitted by the light source 116, reflected from a distant object (e.g., 130), and received by the gated light detector 126. The controller 108, or other electronics associated with the light source 116 and the gated light detector 126, measures the elapsed time from the time a pulse of light was emitted to the time the reflected pulse (or a portion thereof) was received, and the elapsed time is used to calculate a distance at which the object is located. The measured length of time (i.e., time delay) that it takes a pulse of light to travel roundtrip corresponds to the distance to the object, at approximately 6.6 nanoseconds/meter (ns/m). More specifically, since light travels at approximately 3.3 nanoseconds per meter (i.e., the speed of light is approximately 3.3 nanoseconds per meter), the distance to an object can be determined using the equation $d=(c*t)/2$, where c is the speed of light and t is the time delay.

If the goal is to measure this time delay of a few nanoseconds to accuracies of 1 centimeter or less, then a precision of approximately 66 picoseconds would be required. However, such precision is difficult to achieve for various reasons. One of the main difficulties associated within obtaining precise TOF measurements relates to timing signals, and more specifically, timing pulses generated by the precision timing generator 104, which can more generally be referred to as the timing generator 104. More specifically, if the rising and falling edges of timing pulses (produced by the timing generator 104) occur at times that are offset from the desired times, then the TOF measurements that are produced based on such timing pulses will also be offset, which adversely affects the TOF measurements. Embodiments of the present technology, which are described below, can be used to test the precision and/or accuracy of the timing generator 104 and/or calibrate the timing generator 104. Such testing, if performed during a design stage, can be used to improve the design of the timing generator 104 and/or to determine whether a particular design satisfies specified design requirements. Such testing, if performed after the timing generator 104 has been manufactured, can be used to determine whether the timing generator 104 meets specific device or system requirements, and thus, can be used to determine whether a particular instance of the timing generator 104 should be used in a product or discarded. Additionally, or alternatively, such testing, if performed after the timing generator 104 has been manufactured, can be used to calibrate the timing generator 104 and/or to calibration measurements (e.g., TOF measurements) made using the timing generator 104.

Figure 2A:
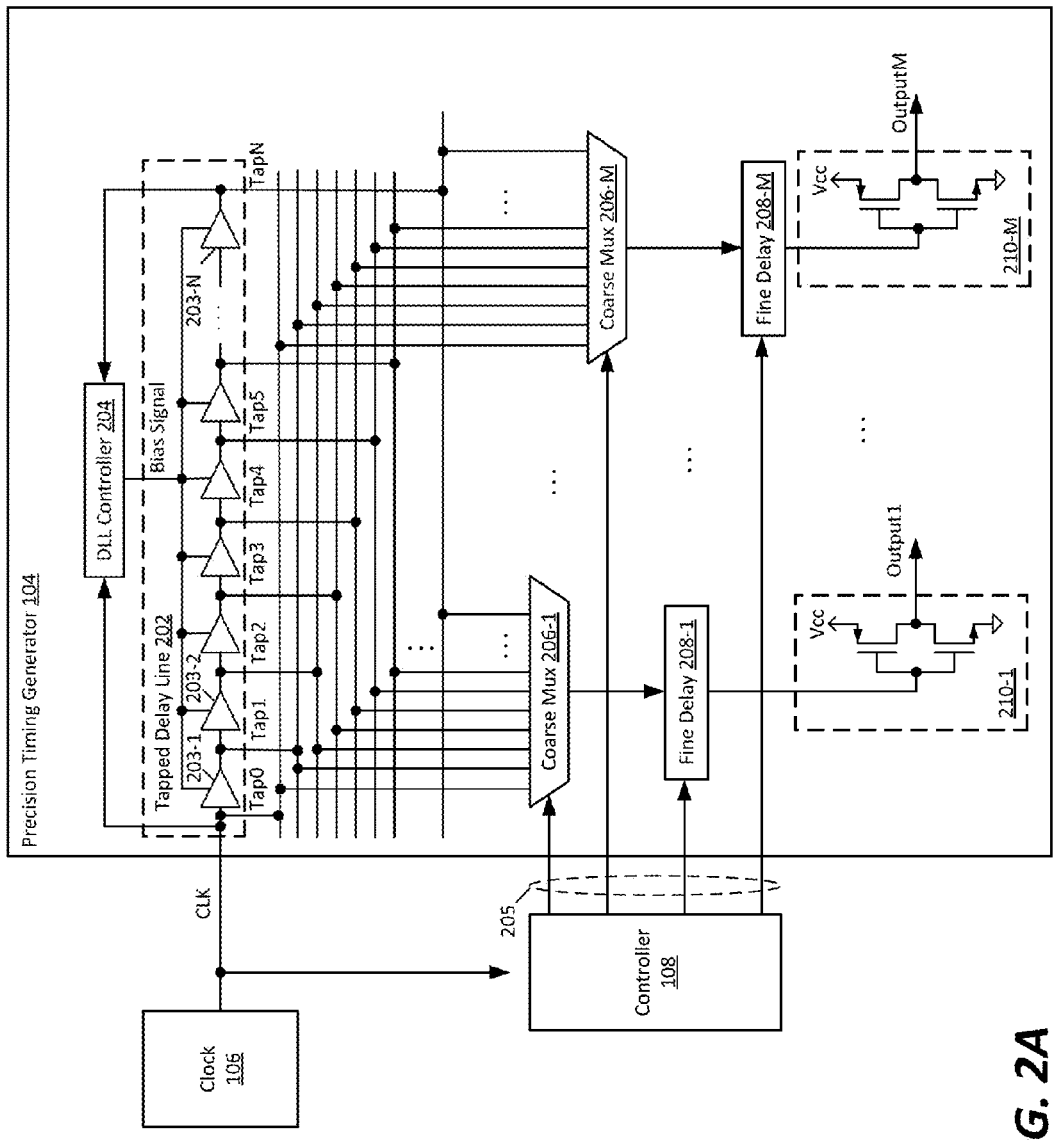
FIG. 2A illustrates an exemplary implementation of the timing generator introduced in FIG. 1.

FIG. 2A illustrates an exemplary implementation of the timing generator 104 introduced in FIG. 1. The timing generator 104 is shown as receiving a clock (CLK) signal from the clock 106, and is controlled by one or more control signals 205 received from the controller 108. The timing generator 104 is shown as including a tapped delay line 202, a delay locked loop (DLL) controller 204, a plurality of coarse multiplexers (MUXs) 206-1 through 206-M, a plurality of fine delay circuits 208-1 through 208-M, and a plurality of output drivers 210-1 through 210-M. The CLK signal is provided to the tapped delay line 202, which is formed by a plurality of delay elements 203-1 through 203-N connected in series and successively delaying the CLK signal to produce a plurality of "tap" signals Tap1 through TapN at the outputs of the delay elements 203-1 through 203-N. A Tap0 signal, shown in FIG. 2A, is the same as the CLK signal.

The tapped delay line 202 can also be referred to as a coarse delay line 202, since it is used to generate coarse delays. The delay elements 203-1 through 203-N of the tapped delay line 202 can individually be referred to as a delay element 203, and can collectively be referred to as delay elements 203. The delay elements 203 can also be referred to as coarse delay elements 203, since they are used to generate coarse delays. Each delay element 203 can be, for example, a logic gate, such as, but not limited to, an inverter logic gate. In an embodiment, each successive tap signal Tap0 though TapN is inverted and delayed from its preceding tap signal by the inherent delay of a delay element 203. The CLK signal (i.e., the Tap0 signal) and the TapN signal are shown as being provided to the DLL controller 204, which generates a bias signal in dependence thereon, and provides the bias signal to each of the delay elements 203. The bias signal controls the switching speed of the delay elements 203 and therefore controls the delay of each delay element 204 so that the last tap signal, TapN, is phase locked to the CLK signal (i.e., the Tap0 signal). Thus the total delay between CLK signal (i.e., the Tap0 signal) and the TapN signal is equal to the period of the CLK signal, which can be referred to as P0. When all of the delay elements 203 are similar, each element's delay is close to the average element delay of P0/N.

The tap signals Tap0 through TapN are inputs to each of a plurality of coarse multiplexers (MUXs) 206-1 through 206-M. The coarse MUXs 206-1 through 206-M can individually be referred to as a coarse MUX 206, and can collectively be referred to as coarse MUXs 206. Each of the coarse MUXs 206 selects one of its inputs signals Tap0 through TapN as its output signal, which is provided to a respective one of a plurality of fine delay circuits 208-1 through 208-M. The fine delay circuits 208-1 through 208-M can individually be referred to as a fine delay circuit 208, and can collectively be referred to as fine delay circuits 208. Each fine delay circuit 208 receives a selected tap signal, output by one of the coarse MUXs 206, and delays the selected tap signal by a small selectable amount (which should be smaller than the average delay provided by each of the coarse delay elements 203), to produce a coarse-plus-fine delay signal, which is provided to a respective one of the output drivers 210-1 through 210-M.

The output drivers 210-1 through 210-M can individually be referred to as an output driver 210, and can collectively be referred to as output drivers 210. Where the output drivers 210 are made up of CMOS transistors, as shown in FIG. 2A, they can also be referred to as CMOS drivers 210. Where the output driver is driving a pin of an integrated circuit (IC), the output driver can be more specifically referred to as a pin driver. In view of the above, the terms output driver, CMOS driver and pin driver may sometimes be interchangeably used. A more detailed description of the exemplary output driver 210 is discussed below with reference to FIG. 3.

The output of each of the output drivers 210 is a timing signal. Accordingly, the timing generator 104 is shown as outputting M separate timing signals, labeled Output1 through OutputM. Each of the timing signals, as noted above, includes timing pulses, each of which has a rising edge and a falling edge, with a pulse width therebetween. Where the timing signal (and the timing pulses thereof) is used to produce a light drive signal (including light drive pulses), the timing signal can more specifically be referred to as a light timing signal, and the timing pulses thereof can be referred to as light timing pulses. Where the timing signal (and the timing pulses thereof) is used to produce a shutter drive signal (including shutter drive pulses), the timing signal can more specifically be referred to as a shutter timing signal, and the timing pulses thereof can be referred to as shutter timing pulses.

The timing generator 104 in FIG. 2A includes M channels. The first one of the channels includes the coarse MUX 206-1, the fine delay circuit 208-1, and the output driver 210-1. The Mth channel includes the coarse MUX 206-M, the fine delay circuit 208-M, and the output driver 210-M. All of the M channels share the same tapped delay line 202. One of the channels can be used, e.g., to produce a light timing signal, while another one of the channels is used to produce a shutter timing signal.

In an exemplary embodiment, the CLK signal provided to the tapped delay line 202 has a frequency of 45 MHz, N equals 128, and M equals 14. For much of the following discussion, this clock frequency and values for N and M are assumed, for the sake of consistency. However, embodiments of the present technology are not limited to use with this specific clock frequency and these specific values for M and N. Where N equals 128, this means there are tap signals Tap0 through Tap128, generated using 128 coarse delay elements 203, which are inputs to each of the coarse MUXs 206. This also means there are 14 coarse MUXs 206, 14 fine delay circuits 208, and 14 output drivers 210, and thus, 14 timing signals (i.e., Output1 through Output14). Each of the timing signals, e.g., Output1 through Output14, includes timing pulses, each of which has a rising edge and a falling edge, with a pulse width therebetween. Such timing pulses can be, e.g., light timing pulses or shutter timing pulses, which were discussed above, but are not limited thereto. Where the CLK signal has a 45 MHz frequency, the period (P0) of the CLK signal is approximately 22.22 nanoseconds (ns) (i.e., P0=1/45 MHz~22.22 ns). Each timing pulse of the timing output signals can be within one clock period (which, as mentioned above, is ~22.22 ns, at 45 MHz), or can extend over several clock periods. Timing control signal(s) 205, produced by the controller 108, are shown as controlling the coarse MUXs 206 and the fine delay circuits 208, and thus, control the timing output signals and the timing pulses thereof. Continuing with this example, where the tapped delay line 202 includes 128 delay elements 203, the tapped delay line 202 can be used to define the rising and falling edges of timing pulses to a coarse delay resolution of $1/128^{th}$ of a CLK period, which is ~174 picoseconds (ps) for a 45 MHz CLK signal (i.e., 22.22 ns/128~174 ps).

The control signal(s) 205 that the controller 205 uses to control the timing generator 104 can include a single signal or multiple signals. For example, where the control signal 205 is a single multi-bit digital signal, a plurality of bits of the control signal 205 can be used to select which coarse MUX(s) 206 and which fine delay circuit(s) 208 are selected (e.g., enabled), and further bits of the control signal 205 can be used to select the output of the selected coarse MUX 206 and to select the output of the selected fine delay circuit 208. It would alternatively be possible for one control signal to select which coarse MUX 206 and fine delay circuit are selected (e.g., enabled), and further control signals to select the output of the selected coarse MUX 206 and to select the output of the selected fine delay circuit 208. Other variations are also possible. The signal and/or bits that is/are used to specify which output of a coarse MUX 206 is selected can be referred to as a coarse code. Similarly, the signal and/or bits that is/are used to specify which output of a fine delay circuit 208 is selected can be referred to as a fine code. It is noted that multiple coarse MUXs 206 and multiple fine delay circuits 208 can be selected at the same time so that multiple timing signals are produced at the same time.

In an exemplary embodiment, each of the fine delay circuits 208 can add one of a plurality of fine delays, e.g., 0 ps, 85 ps, 170 ps or 255 ps, to the tap signal selected by a respective coarse MUX 206. The total delay is the sum of the selected coarse delay and the selected fine delay. In this example the fine delay resolution is 85 ps, which was chosen to be approximately half the coarse delay resolution.

Figure 2B:
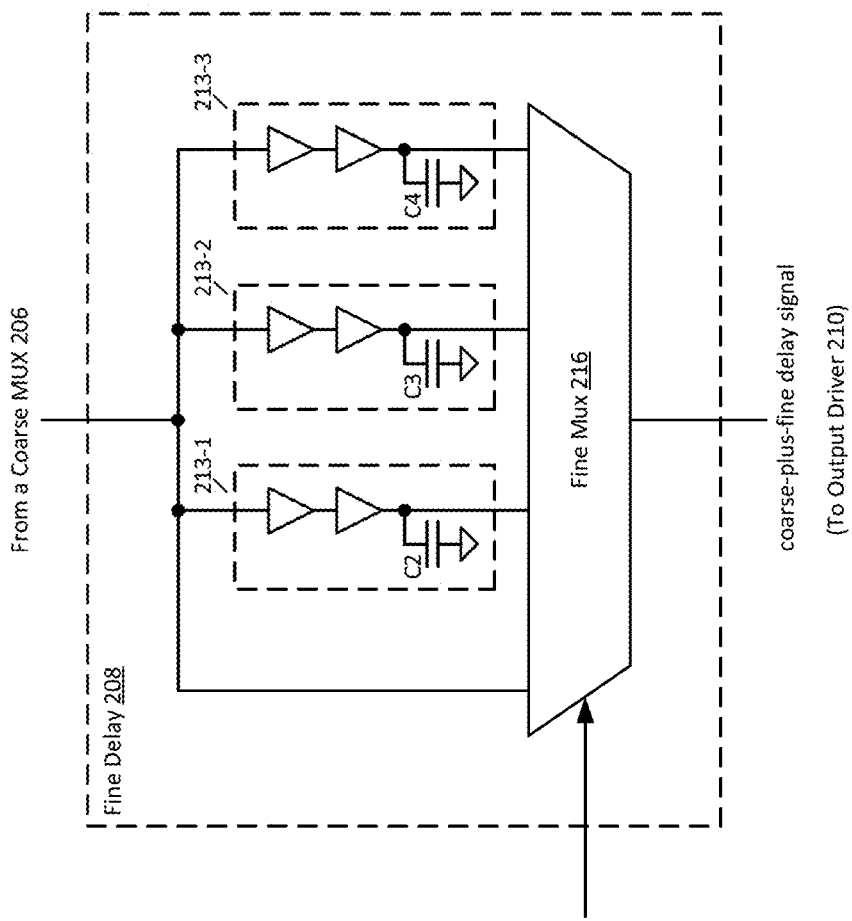
FIG. 2B illustrates an exemplary implementation of each of the fine delay circuits of the timing generator shown in FIG. 2B.

FIG. 2B illustrates an exemplary implementation of each of the fine delay circuits 208. Referring to FIG. 2B, the fine delay circuit is shown as including fine delay elements 213-1, 213-2 and 213-3, and a fine multiplexer (MUX) 216. The input signal to the fine delay circuit 208 is received from a coarse MUX 206, and thus, is one of the tap signals Tap0 through Tap128. The fine delay elements 213-1, 213-2 and 213-3 can be individually referred to as a fine delay element 213, or collectively referred to as fine delay elements 213. While three fine delay elements 213 are shown in FIG. 2B, the fine delay circuit 208 can have more or less than three fine delay elements 213. In the embodiment shown in FIG. 2B, the fine delay provided by each of the fine delay elements 213 is dependent on the size of the capacitor (C2, C3 or C4) included in the fine delay element 213. The fine delay circuit 208 is also shown as including one signal path that provides the input to the fine delay circuit 208 directly to the fine MUX 216, which path can provide a fine delay of 0 ps. The sizes of the capacitors C2, C3 and C4 can be selected, e.g., to provide fine delays of 85 ps, 170 ps and 255 ps, respectively. FIG. 2B illustrates just one example of how the fine delay circuits 208 can be implemented, which is not intended to be all encompassing, since alternative types of fine delay circuits can be used.

Referring again to FIG. 2A, each of the coarse delay elements 203 preferably provides the exact same delay, which is equal to the coarse delay resolution, e.g., 174 ps. However, in actuality, the delay caused by each of the delay elements 203 can vary by as much as +/−50 ps. Further, the fine delay step sizes, provided by the fine delay elements 213 (in FIG. 2B), are preferably the same, e.g., 85 ps. However, in actuality the fine delay step sizes can vary by as much as +/−20 ps. Explained another way, while the coarse delay step values are preferably all 174 ps/step, individual coarse delay step values can be higher or lower than the target coarse delay step value by as much as 30%. Further, while the fine delay step values are preferably all 85 ps/step, individual fine delay step values can be higher or lower than the target fine delay step value by as much as 30%.

Embodiments of the present technology, which are described below, can be used to measure the delays associated with each of the coarse delay elements 203, and more generally, to measure the coarse delay step values over an entire range of coarse delays. Embodiments of the present technology, which are described below, can also be used to measure the fine delays associated with each of the fine delay elements 213, and more generally, to measure the fine delay step values over an entire range of fine delays. In specific embodiments, embodiments of the present technology can also be used to measure the precision and/or accuracy of timing pulses produced by the output drivers 210 in response to coarse-plus-fine delay signals that control the switching of output drivers 210. Such measurements, if performed during a design stage, can be used to improve the design of a timing generator (e.g., 104) and/or to determine whether a particular design satisfies specified design requirements. Such measurements, if performed after the timing generator (e.g., 104) has been manufactured, can be used to determine whether the timing generator meets specific device or system requirements, and thus, can be used to determine whether a particular instance of the timing generator should be used in a product or discarded. Additionally, or alternatively, such measurements, if performed after the timing generator (e.g., 104) has been manufactured, can be used to calibrate the timing generator. More specifically, coarse and fine delay step values can be measured and recorded, e.g., in a calibration table, and used to calibrate out errors or offsets. Such a calibration table, or an equivalent, can be stored, e.g., in memory (e.g., 107).

Figure 3:
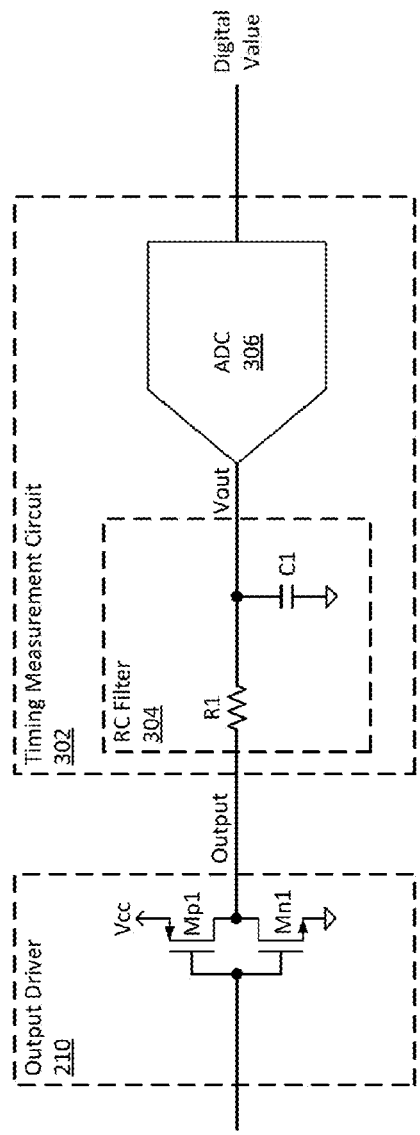
FIG. 3 illustrates a timing measurement circuit, according to an embodiment of the present technology, which is connected to the output of one of the output drivers of the timing generator described with reference to FIG. 2A.
Figure 4:
FIG. 4 illustrates an example signal, output by an output driver, which has a 50% duty cycle, with a PWM cycle time of 44.44 ns (which is two clock cycles where the period (P0) of the CLK signal is 22.22 ns).

In accordance with specific embodiments of the present technology, signal timing can be measured using pulse width modulation (PWM) techniques, which can be appreciated from the below discussion of FIGS. 3 and 4. FIG. 3 illustrates an output driver 110 that is driven by a coarse-plus-fine delay signal output by one of the fine delay circuits 208. Since an output of the output driver 110 is being tested, the output driver 110 can be more generally referred to as a device under test (DUT). The output of the output driver 110, which is a timing signal including timing pulses, is provided to an RC filter 304. As noted above, the timing signal including timing pulses can be a light timing signal including light timing pulses, or a shutter timing signal including shutter timing pulses, but is not limited thereto. The output of the RC filter 304 is provided to an analog-to-digital converter (ADC) 306. The RC filter 304 and the ADC 306 can be collectively referred to as a timing measurement circuitry 302 or subsystem of embodiment of the present technology. As will be discussed in additional detail below, the timing measurement circuit 302 can be used to performing a timing measurement method, according to an embodiment of the present technology.

The exemplary output driver 210 in FIG. 3 is shown as including a pair of CMOS transistors, and more specifically, a PMOS transistor Mp1 and an NMOS transistor Mn1. The PMOS transistor Mp1 has its source connected to Vcc (or more generally, a high voltage rail), the NMOS transistor Mn1 has its source connected to ground (or more generally, a low voltage rail), and drains of the NMOS and PMOS transistors Mn1, Mp1 are connected together, and the gates of the NMOS and PMOS transistors Mn1, Mp1 are connected together. In this configuration, when the input voltage to the output driver 210 (i.e., the coarse-plus-fine delay signal) is high, the NMOS transistor Mn1 turns on and the PMOS transistor Mp1 is turned off, which results in the output of the output driver (which in this example is the connected together drains of the PMOS and NMOS transistors Mp1, Mn1) being pulled to the ground voltage, and thus being low. Conversely, when the input voltage to the output driver 210 (i.e., the coarse-plus-fine delay signal) is low, the NMOS transistor Mn1 turns off and the PMOS transistor Mp1 is turned on, which results in the output of the output driver (which in this example is the connected together drains of the PMOS and NMOS transistors) being pulled to Vcc, and thus being high. The PMOS and NMOS transistors Mp1, Mn1 make good analog switches which connect the output of the output driver 210 to either Vcc or ground through a pure resistance with little offset, which results in the output of the output driver 210 being a square wave that transitions between Vcc and ground. By providing this output of the output driver 210 to the RC filter 304, the output voltage (Vout) of the RC filter 304, which is a DC voltage, can be calculated as follows: Vout=Duty Cycle*Vcc.

Still referring to FIG. 3, the RC filter 304 is shown as including a resistor R1 and a capacitor C1. An exemplary value for the resistor R1 is 10 kiloohms (k$\Omega$), and an exemplary value for the capacitor C1 is 50 nanofarads (nf). These are exemplary values, which are not meant to be limiting. The RC filter 304 shown in FIG. 3 is a passive first-order filter, which can also be referred to as one-pole filter, a single-pole filter or an RC low-pass filter. In alternative embodiments, other types of RC filters can be used. For example, a second-order RC filter can be used, which includes two passive first-order filters connected or "cascaded" together to form a second order or two-pole filter network. It would also be possible to use even higher order RC filters, if desired. A second-order RC filter can also be referred to as a two-pole RC filter. Another exemplary two-pole RC filter that can be used is a Sallen-Key filter.

The square wave signal that is output by the output driver 210 and provided to the RC filter 304 can be treated as or considered a pulse wave modulated (PWM) signal. The RC filter 304 averages pulses of the PWM signal (which is a timing signal output by the timing generator 104, and more specifically by an output driver 210) to produce an RC filter output voltage (Vout), which is a DC voltage that is a direct indication of the effective duty cycle of the PWM signal. Accordingly, if the commanded duty cycle is 50%, then the RC filter output voltage should be exactly 50% of Vcc. Assuming Vcc is 3.00 Volts (V), then the RC filter output voltage (Vout) should be 1.50 V when the commanded duty cycle is 50% (i.e., Vout=Duty Cycle*Vcc=0.50*3.00 V=1.50 V). The RC filter output voltage (Vout), which is a DC voltage, can also be referred to herein as the PWM output voltage. FIG. 4 illustrates an example timing signal, output by an output driver 210, which has a 50% duty cycle, with a PWM cycle time of 44.44 ns (which is two clock cycles where the period (P0) of the CLK signal is 22.22 ns).

Referring again to FIG. 3, the ADC 306 converts the RC filter output voltage (Vout), which is a DC voltage, to a digital value that can be stored and/or analyzed. Explained another way, the ADC 306 is used to measure the voltage of the PWM signal output by the output driver 210, after the PWM signal has been filtered by the RC filter 304. The ADC 306 can, e.g., be a 12-bit ADC, meaning that the ADC 306 has 2^12 (i.e., 4096) different possible digital output values. The ADC 306 can alternatively have a lower resolution than 12-bits, or a higher resolution than 12-bits.

Continuing with the example where the commanded duty cycle is 50%, and Vcc is 3.00 V, then RC filter output voltage should be 1.50 V, as noted above. Assuming that the ADC 306 is a 12-bit ADC (having 4096 different possible digital output values), then a digital value of 2048 is expected to be output by the ADC 306 when the commanded duty cycle is 50%. If the digital value output by the ADC 306 is less than 2048, that means that the actual duty cycle is less than 50%, and if the digital value output by the ADC is greater than 2048, that means that the actual duty cycle is greater than 50%. More generally, if the rise time of a pulse is earlier than commanded relative to the fall time of the pulse, the pulse will be wider, the duty cycle will be higher and the output voltage will be higher. If the rise time is 1% earlier than expected with respect to the fall time, the PWM output voltage (i.e., Vout) will be 1% higher, or 30 millivolts (mV), assuming Vcc=3.00 V. In such a case, if the digital output of the ADC 306 (assuming it is a 12-bit ADC) would be 2088, instead of the expected value of 2048. If the PWM cycle time is 44.4 ns, this 1% corresponds to 0.444 ns or 444 picoseconds. This translates to a resolution of 444/30=14.8 picoseconds/millivolt (ps/mV). If the ADC 306 is a 12-bit ADC (i.e., has 12 bits of resolution), the ADC 306 can resolve 3.00 V/4096 bits=0.75 mV/bit or to 14.8×0.75=11.1 ps/bit.

Referring briefly back to FIGS. 2A and 2B, the duty cycle of pulses of the timing signal output by an output driver 210 of the timing generator 104, which as noted above can be considered a PWM signal, are controlled by the controller 108. More specifically, the controller 108, by controlling the coarse MUXs 206 and the fine MUXs 216, can control which coarse delay elements 203 of the tapped delay line 202, and which fine delay elements 213 of the fine delay circuits 208, are used to produce the coarse-plus-fine delay signals, which can more generally be referred to as the delay signals, that are provided to the inputs of the output drivers 210. The output drivers 210 produce timing signals, in dependence on such delay signals, wherein the timing signals, as noted above, can be considered PWM signals.

For an example, the controller 108 can control the coarse MUX 206-1 to select the Tap1 signal that is output by the delay element 203-1, and can control the fine delay circuit 208-1 such that a 0 ps fine delay is selected. Assuming that the target coarse delay step value is 174 ps/step, then the expected duty cycle of the timing signal output by the output driver 210-1 is 0.78% (i.e., 22.22 ns/174 ps=1/128=0.0078=0.78%). Using the equation Vout=Duty Cycle*Vcc, this means that the expected DC voltage output of the RC filter is Vout=0.0078*3.00 V=0.023 V. Again, assuming that the ADC 306 is a 12-bit ADC, then the expected output of the ADC 306, when Vout=0.023V, is a digital value of 31 (i.e., (0.023 V/3.00 V)*4096=31). If the digital value produced by the ADC 306 is larger than 31, then it can be concluded that the delay element 203-1 produced a delay greater than its target 172 ps delay. Conversely, if the digital value produced by the ADC 306 is less than 31, then it can be concluded that the delay element 203-1 produced a delay less than its target 172 ps delay. Similar methods can be used to measure the delays produced by each of the coarse delay elements 203 of the tapped delay line 202 as well as each of the fine delay elements 213 of each of the fine delay circuits 208. Additional details of how to determine errors associated with a timing generator (e.g., 104), as well as producing a calibration table for use in calibrating a timing generator and/or calibrating measurement made using a timing generator, are provided below.

Figure 5:
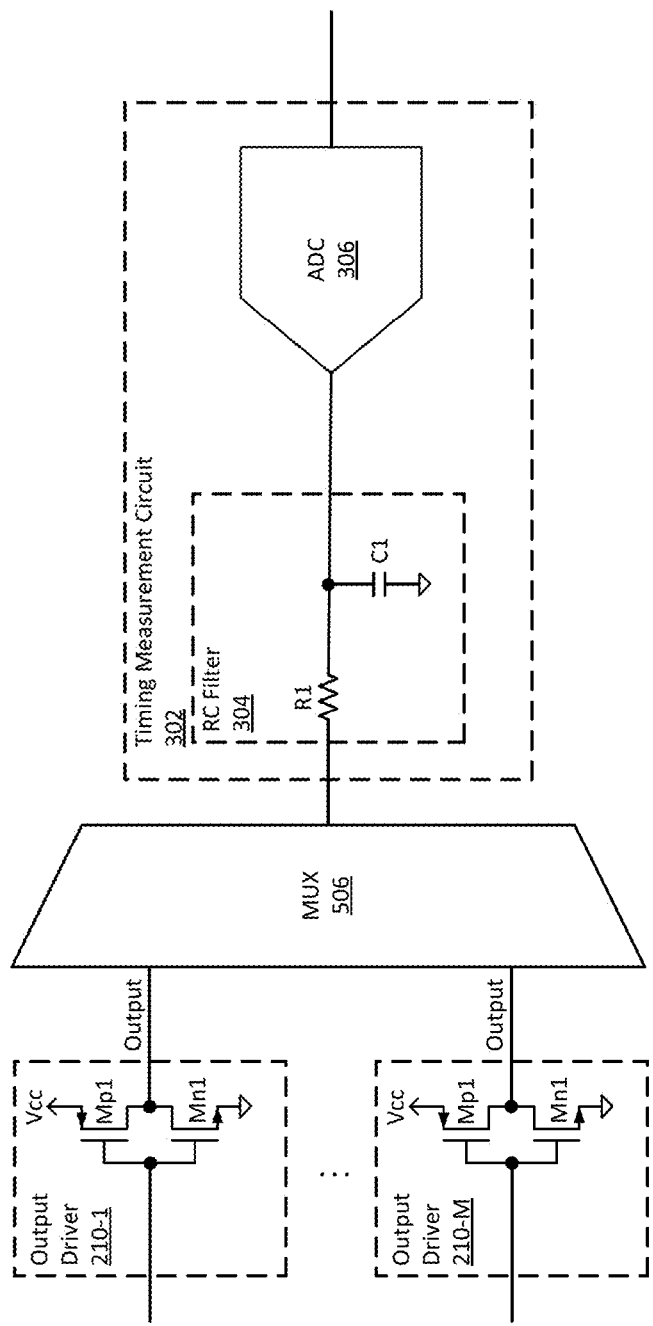
FIG. 5 illustrates how a single instance of the time measuring circuit, introduced in FIG. 3, can be shared by all of the output drivers of a timing generator.
Figure 6:
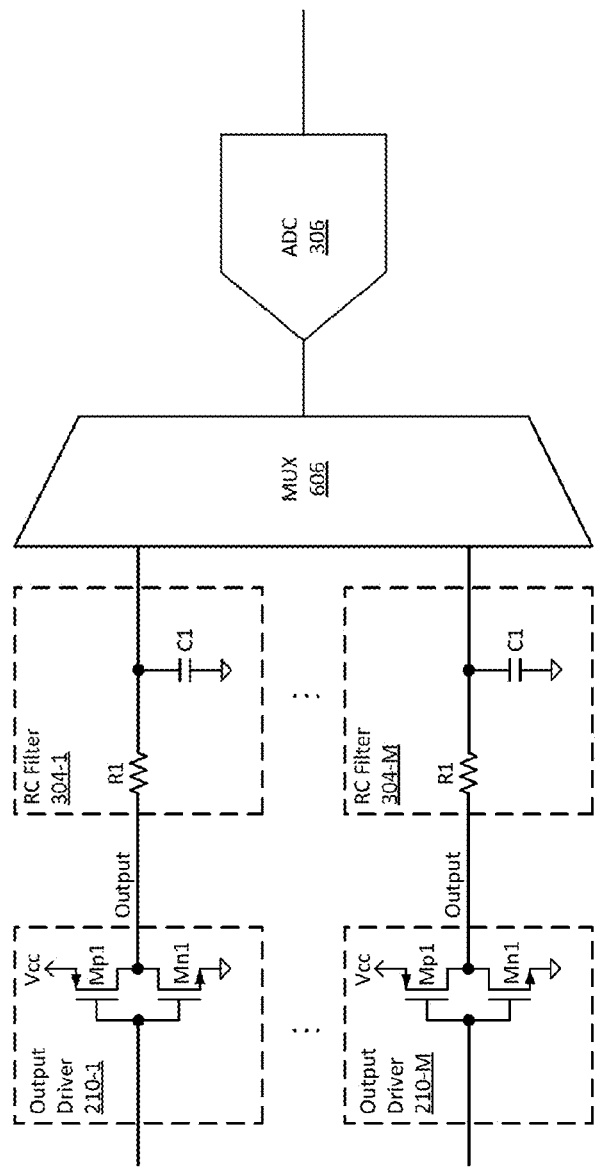
FIG. 6 illustrates how an ADC portion of a timing measurement circuit can be shared by all of the output drivers of a timing generator, while each of the output drivers can have its own RC filter portion of the timing measurement circuit.

Referring briefly back to FIG. 2A, the time measuring circuit 302 (shown in FIG. 3) can be connected to the output of each output driver 210. In one embodiment, a separate instance of the time measuring circuit 302 can be connected to a separate one of the outputs (i.e., Output1 through OutputM) of the output drivers 210-1 through 210-M, which would require M instances of the time measuring circuit 302, and thus, M separate ADCs 306. Alternatively, as shown in FIG. 5, a single instance of the time measuring circuit 302 can be shared by all of the output drivers 210-1 through 210-M by including a multiplexor (MUX) 506 between the outputs (i.e., Output1 through OutputM) of the output drivers 210-1 through 210-M. A possible problem with such a configuration would be that when switching between measuring outputs of different output drivers 210, it would be necessary to let the shared RC filter 304 settle, which can limit how fast a plurality of timing measurements can be made using the timing measurement circuit 302. In another embodiment, shown in FIG. 6, each of the output drivers 210-1 through 210-M can have a separate RC filter 304-1 through 304-M connected to its output, and a multiplexer (MUX) 606 that enables the same ADC 306 to be shared by all of the output drivers 210. A benefit of the embodiment of FIG. 6 is that each of the RC filters 301 can independently settle, and only a single ADC 306 is needed, thereby allowing fast timing measurements while minimizing the number of ADCs.

Referring back to FIGS. 2A, 2B and 3, in accordance with an embodiment, the controller 108 can control each of the coarse MUXs 206 and fine MUXs 216 such that every possible coarse delay (i.e., every possible Tap delay signal) with a fine delay of 0.0 ps is used to produce a timing signal output at each of the output drivers 210, and the timing measuring circuit 302 (or an instance thereof) can be used to produce a digital value for each timing signal output. The same process can be performed for the various different fine delay outputs alone and/or in combination with the various different coarse delay outputs, and the timing measuring circuit 302 (or an instance thereof) can be used to produce a digital value for each of the possible timing signal outputs. Such digital values can be analyzed, manually, automatically, or using a combination thereof, to determine the actually delays associated with each of the coarse delay elements 203 and/or fine delay elements 213 of the timing generator 104.

In accordance with specific embodiments, when timing measurements are made there are the following assumptions: rise and fall times are stable with respect to time; and rise and fall times are independent of position in the wave form. Further assumptions can also made for convenience, but are not required, because if they are violated, the effects are cancelled out by the nature of differential measurement, i.e. T=(tap N−tap 0). One further assumption is that rise and fall times are equal. Another further assumption is that a finite rise or fall time delays its edge by half the rise/fall time. If the rise and fall times are equal, their effects on the pulse width cancel out. If rise is slower than fall, the pulse will be shorter than expected. If the fall is slower than the rise, the pulse will be longer than expected. However, the delay error is constant, independent of tap number. Therefore, differential measurements (tap n−tap 0) will cancel out this offset. Still another further assumption is that output driver high and low output resistances are equal. If the high and low output driver output resistances are equal, they cancel out in the measurement, except for an increase in the RC filter time constant. If they are unequal, they can cause an error at mid-scale (duty cycle=50%) that declines to zero at 0% and 100%. The DC error will be a maximum of 0.025% for a 10 ohm imbalance and a 10 KΩ resistor R1 in the RC filter 304, which is approximately 1 LSB at 12 bits.

Rise and fall ringing amplitudes and shapes are assumed to be equal. If the high and low output driver output overshoot and ringing waveforms are equal, they cancel out in the measurement, assuming that the overshoot is small, e.g. <30% and the ringing time is much less than the pulse high or low time during which the ringing occurs. Overshoot and ringing will tend to raise an output voltage (at the output of an output driver) for rising edges and lower the output voltage for falling edges, because the overshoot voltage× time is higher than the following ringing. For rising edges, this will make the edge appear sooner than expected; for falling edges, it will make the edge appear to also occur earlier than expected. If the two wave shapes are equal but opposite in magnitude, they will cancel out. If they are not equal, the effect of the larger of the two will create its effect of apparently moving its edge relative to its opposite companion. However, for differential measurements (e.g., tap n−tap 0), these effects will cancel out in the subtraction, as mentioned above.

There are various measurement possibilities that can be made using embodiments of the present technology. In other words, embodiments of the present technology can be used to make the various types of useful measurements, examples of which are discussed below.

In order to measure the output symmetry of an output driver 210, a 50% duty cycle output using the same tap, e.g., tap 0, can be produced by driving the output low during a first CLK cycle and high during a second CLK cycle. If the rise time is faster or slower than the fall time, this will show up as a duty cycle greater or less than 50%, with a corresponding measurable change in PWM output voltage (i.e., Vout of an RC filter 304), and thus, the digital value output by the ADC 306.

A tap-to-tap delay can be measured by moving the rising edge of the pulse. If the rising edge is moved one tap higher (while not moving the falling edge), the pulse will be 1/128 (0.78%) narrower and the output voltage will be reduced accordingly. If the measured voltage differs from the expected voltage, the timing error can be calculated using the measurement resolution of 14.8 ps/mV. If the Vout voltage (and thus, the digital value output by the ADC 306) is higher than expected, the signal is early, the expected added delay is too low, and the timing error is negative. If the Vout voltage (and thus, the digital value output by the ADC 306) is lower than expected, the signal is late, the delay is too high and the timing error is positive. Rising edge tap-to-tap delay can be measured as described above. Falling edge tap-to-tap delay can be measured in a similar manner by inverting the waveform, having the first half be high, the second half be low and moving the center, i.e., the high to low transition. Note that the tap-to-tap delays being measured in the above examples are relative to tap 0 in the waveform.

In accordance with specific embodiments, tap-to-tap delays can be measured using a PWM duty cycle method by moving the center edge of a PWM waveform. This should work well for moderate duty cycles, e.g., between 20% and 80%. However pulses may be too narrow at the ends, e.g., where the duty cycle approaches 1% or 99%. In these cases, the pulses will be very narrow and can result in a triangular wave output, rather than a square wave output, resulting in errors in the time calculations. A solution to this problem is to make the measurement square wave two clock cycles long, being low in the first clock time and high in the second clock time (for low to high edge measurements). The measurements can be split into two groups: e.g., taps 0 to 63 and taps 64 to 127, assuming there are 128 taps. Note that there are two sets of 128 taps in this waveform, one in the first half and one in the second half and that tap 0 occurs at the beginning, center and end of the waveform. This is shown in FIG. 7.

Figure 7:
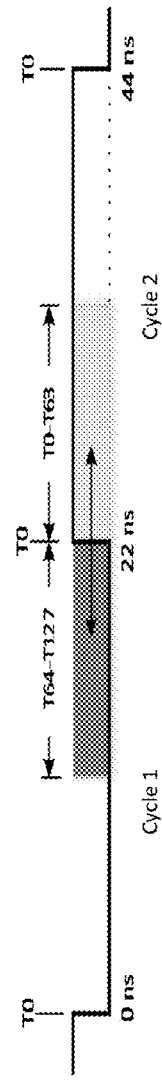
FIG. 7 is used to illustrate how measurements made in accordance with embodiments of the present technology can be split into two groups, one of which is associate with half the taps of a tapped delay line of a timing generator, and the other of which is associate with the other half of the taps of the tapped delay line.

Referring to FIG. 7, to test the 0 to 63 tap group, the center edge is moved later in time in cycle two, so that as the tap number tested goes from 0 to 63, and the duty cycle decreases from 50% to 25%. To test the 64 to 127 tap group, the edge is moved earlier in time in cycle one, so that as the tap number tested goes from 64 to 127, and the duty cycle increases from 50% to 75%. This keeps the test duty cycle between 25% and 75% while testing all taps.

Coarse delay measurements can be made as follows. The timing generator 104 is driven by the CLK signal (e.g., having a frequency of 45 MHz), which will cause the timing generator 104 to generate one of 128 delayed output rising or falling values, depending on which delay value is selected. They are numbered 0 to 128, with 0 being coincident in time to the CLK signal rising edge. The intent of the coarse delay measurements is to measure the actual time delay of each output signal relative to the initial, 0 time delay. This enables the delay of each of the coarse delay elements 203 to be determined.

Assume the timing generator 104 is driven by a 45 MHz CLK signal, which has a period of 22.22 nanoseconds. For specific tests, the timing generator 104 can be set up to provide a repeating cycle of two clock periods for a total cycle time of 44.44 ns, as was shown in FIG. 4 and in FIG. 7. The output signal will initially be low, going high at some time between 11 ns and 34 ns, going low again at the end of the cycle. The low to high transition can be programmed to occur at any point between 11 and 34 ns. If it is set to 11.11 ns, the output duty cycle will be 11.11 ns/44.44 ns=75.0%. If it is set to 33.33 ns, the output duty cycle will be 25.0%. Using this two-clock-period cycle technique, the low-to-high transition of the output can be positioned to occur at any of the 128 tap intervals in one of the two 22.22 ns clock periods. The center of the two clock periods, i.e., the 22.2 ns point, corresponds to tap 0 of the second cycle of 128 taps. The 11.11 ns point corresponds to tap 32, and the 33.33 ns point corresponds to tap 96.

As illustrated in FIG. 7, the two-clock timing diagram has a 44.44 ns cycle time. Referring to the timing measurement circuit 302 in FIG. 3, if the RC filter 304 is a single-pole filter having a 50 microsecond (ps) time constant, then the RC filter 304 will convert the duty cycle of the timing signal (output by the output driver 210) to a DC voltage (Vout) with a ripple of less than 0.1% (i.e., (44.44/50*10^−3)<0.1%) of the Vcc value that powers the output driver 210. By converting this resolution to time, the position of the center edge can be measured to a resolution of 0.1%*44.44 ns=44.44 ps. Accordingly, in this example the time-to-voltage conversion value for a Vcc value of 3.00 V will be 14.81 ps/mV (i.e., 44.44/3.00=14.81 ps/mV).

The measurement resolution can be increased by increasing the RC time constant. For example, increasing the RC time constant by a factor of 4 (e.g., from 50 µs to 200 µs) will decrease the ripple by a factor of 4 and increase or resolution by a factor of 4. This will give a resolution of 44/4=11 psec.

The measurement time can be decreased by decreasing the settling time. This can be done, for example, by using a two-pole RC filter, such as a Sallen-Key filter, in place of the single-pole filter 304 shown in FIG. 3. A Sallen-Key filter is considered a type of RC filter because it includes, among other elements, resistive and capacitive elements. A two-pole filter with a roll-off time constant of 10 µs would give a 12-bit resolution, as compared to a single-pole filter with a roll off time constant of 200 ps, which is a 20× improvement. A reason for doing this would be to decrease the time required to perform timing measurements, which can be referred to as the test time. The cost of using a two-pole Sallen-Key filter would be relatively low since such a filter uses only one operational amplifier. There are other ways in which test time (i.e., the time required to perform timing measurements in accordance with embodiments of the present technology) can be reduced, some of which are discussed below.

Referring to FIGS. 2A and 6, in accordance with specific embodiments, all of the M timing outputs produced by the timing generator 104 (at the output drivers 210-1 through 210-M) can be measured simultaneously by having all of the filters (e.g., 304-1 through 304-M) settle at the same time, then scanning the filter outputs using a single fast scanning ADC 306, or using multiple ADCs (i.e., one per output driver output). This assumes minimal output to output crosstalk.

In accordance with certain embodiments, the filter tap values are measured sequentially so that the step-to-step change in the PWM waveform is small. This beneficially enables the filter outputs to settle to their new values more quickly, reducing the time required for the output values of the filters to settle to within 0.025% (12 bit ADC) of its final value.

The timing generator 104 can produce multiple timing signals, including timing pulses, with precise timing relationships. The precision of the relationships between timing edges is determined by a relative accuracy of the output timing signals. Relative accuracy can be defined as timing accuracy relative to a single reference timing signal, such as the rising edge of a selected reference tap (e.g., tap 0) and a selected reference output, e.g., Output 1, which can also be referred to as high precision timing output 1 (HPT1).

Timing accuracy is defined by the error between an output under test signal rising or falling time relative to the rise time of the signal from the reference tap (tap 0) from the reference output (HTP1). For example, an output could be programmed (using specific coarse and fine codes) to have its rising edge occur 1.700 ns after the reference edge from HTP1, but its actual edge may occur 1.813 ns after the reference edge. This is in error by +0.113 ns=113 picoseconds late.

If the actual timing output values from the ADC(s) 306 of timing measurement circuit(s) 302 are determined and stored for each combination of the coarse and fine codes, thereafter a code that will achieve a value closest to a desired output value can be selected. Such a technique can be used in a system that produces TOF measurements to determine distance measurements and/or depth values, such as the system 102 described above with reference to FIG. 1. Alternatively, coarse and fine codes can be used to produce a coarse-plus-fine delay signal that is used to produce a timing signal (e.g., a light timing signal or a shutter timing signal), and an algorithm can calibrate TOF measurements to correct for errors due to timing. To do these kinds of corrections, timing values can be measured and recorded in a calibration table.

Techniques described above can be used to acquire the relative time of the delay taps for each channel of a timing generator. In accordance with an embodiment, a method of acquiring such data is as follows:

The measuring pattern is a 2-clock-cycle pattern.
The pattern starts with the output falling edge at the start of the first clock cycle (T0).
The output rising edge occurs at the start (T0) of the second clock cycle.
The falling edge is at the end of the second clock cycle, also the start (T0) of the next pattern.
The result is a 50% duty cycle square wave, low during the first clock, high during the second.
Measure and record the digital value (output by the ADC 306) for the starting pattern.
This will value correspond to tap 0.
Measure the values for each of taps 1-63 by moving the rising edge progressively later.
This will shorten the pulse, changing its duty cycle from 50=>25%.
Measure the digital values (output by the ADC 306) for each of taps 64-127 by moving the rising edge of the pulse sooner.
The rising edge will start at tap 64 in the first clock cycle
This will lengthen the pulse, changing its duty cycle from 50%=>75%.

In accordance with specific embodiments of the present technology, coarse delay measurements are converted to time values using techniques described below. It is known what the delay values should be with respect to tap 0 for each coarse delay tap, as given by the following equation (assuming 128 taps and a two-clock-period cycle): Coarse Delay (n)=(n/128)*(clock period)=(n/128)*44.44 ns, where n refers to the tap. For example, Coarse Delay (0)=0.0 ns, and Coarse Delay(127)=(127/128)*(44.44)=44.09 ns.

The following equations can be used to determine the expected RC filter voltage output values (Vout), which can be referred to as PWM(n), for each coarse delay tap 0 through N, depending on whether the tap is in a first group (e.g., the 0 to 63 tap group) or a second group (e.g., the 64 to 127 tap group):

PWM(n)=3.00 Volts*(0.50−Tap(n/128)*(0.5)) {For taps 0-63}

PWM(n)=3.00 Volts*(1.00−Tap(n/128)*(0.5)) {For taps 64-127}

For example, the expected PWM output for tap 0=1.500 Volts (50% duty cycle), per the first of the above two equations. For another example, the expected PWM output for tap 64 is 2.250 Volts (75% duty cycle), per the second of the above two equations. Thus, the expected output value from the ADC 306 (assuming a 12-bit ADC) is 2048 for a 50% duty cycle, and 3072 for a 75% duty cycle.

In accordance with specific embodiments of the present technology, coarse delay correction values can be determined and stored, e.g., in a calibration table. More specifically, expected values for each possible coarse delay can be determined and compared to measured values for each possible coarse delay. If the value measured differs from the value expected by the PWM to voltage conversion equations above, this amounts to a delay error. If the difference is positive, the signal is early. This is because a higher Vout voltage (and corresponding digital value output by the ADC 306) than expected means that the starting edge started earlier than expected. Likewise, if the difference is negative, the signal is later than expected (i.e., the pulse is narrower than expected).

The value of the delay error can be calculated using the following equation: Delay error=((PWM(n)−measured(n))/(3.00 Volts))*(44.44 ns). For an example, delay error=14.8 ns/volt of error=14.8 picoseconds/millivolt of error. These delay error values are expected to be to less than 0.5 ns of error or less than 7.4 mV. An 8-bit number could encode the error as a correction value to a resolution of 0.5 ns/128=3.9 picoseconds, positive or negative.

The above described method for determining delay errors can be applied to the fine delay measurements as well, as follows:
Set the delay PWM at 50%, corresponding to tap 0.
For each output:
Measure the PWM output voltage value for a fine tap value of 0; and
Measure the PWM voltage for each fine delay tap, 0-3.

In accordance with specific embodiments of the present technology, fine delay measurements are converted to time values. It is known what the delay values should be with respect to tap 0 for each fine delay tap, as given by: Fine Delay (n)=n*(85 picoseconds per tap), assuming an 85 ps fine delay resolution. For example, Fine Delay (0)=0.0 ps, and Fine Delay(3)=(3*85 ps)*=255 ps=0.255 ns. It is also known what the PWM filter voltage output values should be for each Fine Delay (FD) tap, as given by the equation: PWM (n)=3.00 Volts*(0.50−FD tap(n)*((0.085))/44.44))= 1.50V−1.91 mV=1.4989 V.

In accordance with specific embodiments of the present technology, calibration values or recorded (i.e., stored), e.g., in a calibration table. Such a calibration table can be stored, e.g., in memory (e.g., 107). A simple approach is to measure and record correction values for each coarse delay tap and each fine delay tap for each driver output. Continuing with the above example, this would require:
264 bytes per output
128 bytes of Coarse low to high correction per output
128 bytes of Coarse high to low correction per output
4 bytes of Fine low to high correction per Fine output
4 bytes of Fine high to low correction per Fine output
Times 14 precision timing outputs
Equals 3,696 bytes<4K bytes.
To the above the following can be added: 4-8 bytes of serial number.

If the coarse MUXs 206 introduce little differential delay among them, this could be simplified to recording the correction values for the tapped delay line 202 (also known as the coarse delay line) plus offset values for outputs other than the reference output HPT1. Continuing with the above example, the result would be:
256 bytes per Coarse delay line (one time)
128 bytes of Coarse low to high correction for HPT1 output
128 bytes of Coarse high to low correction for HPT1 output
112 bytes per output
4 bytes of Fine low to high correction per Fine output
Tap 0 value is offset from HPT1 tap 0 value
4 bytes of Fine high to low correction per Fine output
Tap 0 value is offset from HPT1 tap 0 value
Times 14 precision timing outputs
Equals 368 bytes<512 bytes, <4K bits
To this is added: 4-8 bytes of serial number The high level flow diagram of FIG. 8 will now be used to summarize methods according to certain embodiments of the present technology that were discussed in further detail above. Such methods are for use with a timing generator (e.g., 104) having an output driver (e.g., 210) at which a timing signal having timing pulses is output.

Figure 8:
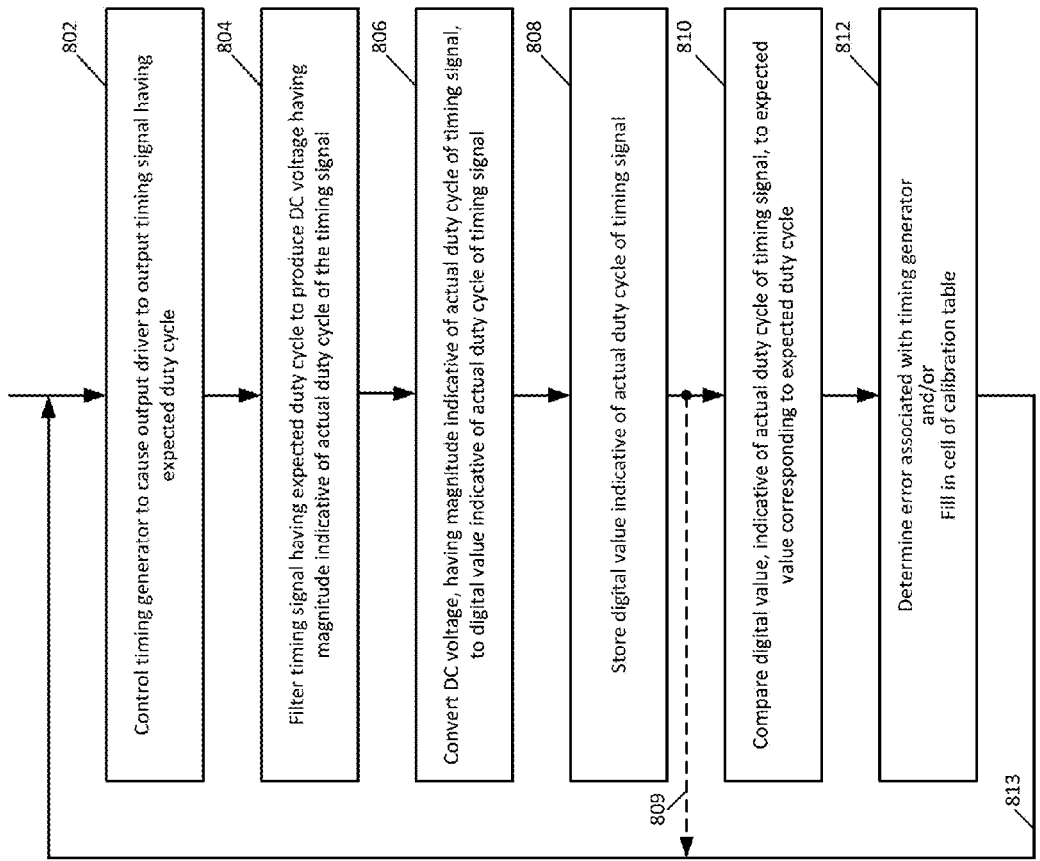
FIG. 8 is a high level flow diagram that is used to summarize methods according to various embodiments of the present technology.

Referring to FIG. 8, step 802 involves controlling the timing generator to cause the output driver to output a timing signal having an expected duty cycle. The expected duty cycle, which may be a commanded duty cycle, can be, e.g., 50%. As was described above with reference to FIGS. 4 and 7, the cycle time of the timing signal (having the expected duty cycle) can span two cycles of a CLK signal that drives a tapped delay line (e.g., 202) of the timing generator.

Still referring to FIG. 8, step 804 involves filtering the timing signal having the expected duty cycle to produce a DC voltage having a magnitude indicative of an actual duty cycle of the timing signal. Step 804 can be performed using an RC filter, examples of which were discussed above. A first-order RC filter 304 that can be used to perform step 804 was shown in and discussed above with reference to FIG. 3. Alternatively, a higher order RC filters can be used, which settles faster than a first-order RC filter, and thus, allows for faster measurements to be achieved.

Step 806 involves converting the DC voltage, having the magnitude indicative of the actual duty cycle of the timing signal, to a digital value indicative of the actual duty cycle of the timing signal. Step 806 can be performed by an ADC (e.g., 306). The ADC can be, for example, a 12-bit ADC, but is not limited thereto. Step 808 involves storing (e.g., in memory 107, or some other memory) the digital value indicative of the actual duty cycle of the timing signal. Step 808 can also involve storing the expected value associated with the expected or commanded duty cycle.

Step 810 involves comparing the digital value, indicative of the actual duty cycle of the timing signal, to an expected value corresponding to the expected duty cycle. The expected value can be determined beforehand for all expected duty cycles that are to be tested, or can be determined as needed or on demand. Step 810 can be performed immediately after steps 806 and 808 are performed. Alternatively, as represented by dashed line 809, the digital values produced at multiple instances of step 806 can be stored at multiple instances of step 808, and the stored values can be used at a later point in time, e.g., after a separate digital value is stored for each of the expected duty cycles to be tested.

Assume, for an example, that a commanded duty cycle (and thus expected duty cycle) is 50%, Vcc is 3.00 V, and the ADC used to preform step 806 is a 12-bit ADC. In such a case, the expected DC voltage produced by an RC filter at step 804 is 1.50 V, and the expected digital value produced by the 12-bit ADC at step 806 is 2048. Details of why this is the case were described in additional detail above. If it is determined at step 810 that the digital value produced by the ADC at step 806 (and stored at step 808) is less than the expected value of 2048, then that means that the actual duty cycle is less than 50%. If the digital value output by the ADC at step 806 (and stored at step 808) is greater than the expected value of 2048, then that means that the actual duty cycle is greater than 50%.

Still referring to FIG. 8, step 812 involves determining an error associated with the timing generator, in dependence on results of the comparing at step 810. Additionally, or alternatively, step 812 involves filling in at least one cell of a calibration table that can be used to calibrate the timing generator and/or calibrate a measurement made using the timing generator. As indicated by line 813, the above described steps are repeated for each of a plurality of different expected duty cycles.

The timing generator (with which the methods described with reference to FIG. 8 can be used) can have a tapped delay line (e.g., 202) and a fine delay circuit (e.g., 208). Such a tapped delay line includes a plurality of coarse delay elements (e.g., 203) that are connected in series and are used to produce a plurality of different tap signals, each of which is delayed by a different amount relative to a clock (CLK) signal that drives the tapped delay line. Such a fine delay circuit can include a plurality of fine delay elements (e.g., 213) used to provide a plurality of different fine delays that can be added to a selected one of the tap signals to produce a coarse-plus-fine delay signal that drives the output driver to produce the timing signal. In such an embodiment, step 802 can involve controlling which tap signal is selected and which fine delay is added to the selected one of the tap signals to produce the coarse-plus-fine delay signal that drives the output driver to produce the timing signal. In accordance with specific embodiments, the above described steps are repeated for each of a plurality of different expected duty cycles, to thereby determine errors associated with each of the coarse delay elements (of the tapped delay line) and each of the fine delay elements (of the fine delay circuit). Additionally, or alternatively, the above described steps are repeated for each of a plurality of different expected duty cycles to fill in all of the cells of a calibration table.

A calibration table, which is generated as described above, can thereafter be used to calibrate the timing generator for which the table was created. For example, a controller (e.g., 108) can use the calibration table to determine which coarse and fine codes should be used to achieve a specific timing signal. In other words, the controller can map different potential instances of the timing signal to different combinations of coarse and fine codes. The calibration table can alternatively be used to calibrate a measurement made using the timing generator. For example, if a TOF measurement is made based on timing signals produced by a timing generator, the calibration table can be used to modify the TOF measurement to be more accurate, to take into account errors that are due to the timing generator.

Referring briefly back to FIG. 2A, a timing generator (e.g., 104) can have more than one output driver (e.g., 210) at each of which a respective timing signal having timing pulses is output. In such a case, the steps described with reference to FIG. 8 can be performing for each of the timing signals output by each of the output drivers of the timing generator.

Referring briefly back to FIG. 3, the timing measurement circuit 302 can alternatively be referred to as a subsystem, wherein such a subsystem is for use with a timing generator having an output driver at which a timing signal having timing pulses is output. In accordance with specific embodiments, such a subsystem includes an RC filter and an ADC. The RC filter filters a timing signal having an expected duty cycle, which is output by the output driver, to produce a DC voltage having a magnitude indicative of an actual duty cycle of the timing signal. The ADC is coupled to the RC filter and converts the DC voltage, which is produced by the RC filter and has the magnitude indicative of the actual duty cycle of the timing signal, to a digital value indicative of the actual duty cycle of the timing signal.

In accordance with specific embodiments, in response to the timing generator being controlled to modify the timing signal to have each of a plurality of different expected duty cycles, the RC filter and the ADC collectively produce a respective different digital value, for each of the different expected duty cycles, indicative of the actual duty cycle of the timing signal. Such a subsystem can also include memory that stores the digital values produced by ADC for the plurality of different expected duty cycles. The memory can alternatively, or additionally, store error values indicative of differences between expected values associated with the plurality of different duty cycles and respective digital values produced by the ADC in response to the timing signal being provided to the RC filter. The digital values and/or the error values can be stored in one or more tables in the memory.

A system, according to an embodiment of the present technology, includes a controller (e.g., 108) and a timing generator (e.g., 104) controlled by the controller to produce a timing signal, which over time, is modified to have each of a plurality of different expected duty cycles. The system also includes an RC filter (e.g., 304) that filters the timing signal having expected duty cycles to produce DC voltages having magnitudes indicative of actual duty cycles of the timing signal. Additionally, the system includes an ADC (e.g., 306) that converts the DC voltages, which are produced by the RC filter and have the magnitudes indicative of the actual duty cycles of the timing signal, to digital values indicative of the actual duty cycles of the timing signal. The timing generator of the system can include a tapped delay line and a fine delay circuit. The tapped delay line, which includes a plurality of coarse delay elements connected in series, is used to produce a plurality of different tap signals, each of which is delayed by a different amount relative to a clock (CLK) signal that drives the tapped delay line. The fine delay circuit, which includes a plurality of fine delay elements, is used to provide a plurality of different fine delays that can be added to a selected one of the tap signals to produce a coarse-plus-fine delay signal that drives an output driver of the timing generator to produce the timing signal. Multiplexors (e.g., 206 and 208) can be used to select one of the tap signal and to select one of the fine delays, as was described in additional detail above. More generally, the controller controls which one of the tap signals is selected and which fine delay is added to the selected one of the tap signals to produce the coarse-plus-fine delay signal that drives the output driver to produce the timing signal. The controller, or a further controller, can determine and store errors associated with each of the coarse delay elements and each of the fine delay elements. The controller, or a further controller, can produce a calibration table for the timing generator.

Referring briefly back to FIG. 1, a system (e.g., 102) can also include a light source (e.g., 116) and a light detector (e.g., 126) and be adapted to produce time-of-flight (TOF) measurements in dependence how long it takes pulses of light, emitted by the light source, to reflect off an object and be detected by the light detector. In such a system, the timing signal can be a light timing signal that is used to produce a light drive signal that drives the light source, or a shutter timing signal that is used to produce a shutter drive signal that is used to drive the light detector.

Additional details of the methods summarized with reference to FIG. 8 were provided above, e.g., in the discussion of FIGS. 1-7.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:
1. A method for use with a timing generator having an output driver at which a timing signal having timing pulses is output, the method comprising:
controlling the timing generator to cause the output driver to output a timing signal having an expected duty cycle;

filtering the timing signal having the expected duty cycle to produce a DC voltage having a magnitude indicative of an actual duty cycle of the timing signal;
converting the DC voltage, having the magnitude indicative of the actual duty cycle of the timing signal, to a digital value indicative of the actual duty cycle of the timing signal;
comparing the digital value, indicative of the actual duty cycle of the timing signal, to an expected value corresponding to the expected duty cycle; and
determining an error associated with the timing generator in dependence on results of the comparing;
filling in at least one cell of a calibration table in dependence on the determined error, wherein the calibration table can be used to at least one of calibrate the timing generator or calibrate a measurement made using the timing generator;
repeating the controlling, the filtering, the converting, the comparing, the determining and the filling, for each of a plurality of different expected duty cycles, to thereby fill in multiple cells of the calibration table; and
using the calibration table to at least one of calibrate the timing generator or calibrate a measurement made using the timing generator.

2. The method of claim 1, wherein:
the filtering the timing signal is performed using an RC filter; and
the converting the DC voltage is performed using an analog-to-digital converter (ADC).

3. The method of claim 1, wherein the timing generator comprises:
a tapped delay line including a plurality of coarse delay elements connected in series, the tapped delay line used to produce a plurality of different tap signals, each of which is delayed by a different amount relative to a clock (CLK) signal that drives the tapped delay line; and
a fine delay circuit including a plurality of fine delay elements, the fine delay circuit used to provide a plurality of different fine delays that can be added to a selected one of the tap signals to produce a coarse-plus-fine delay signal that drives the output driver to produce the timing signal; and
wherein the controlling the timing generator to cause the output driver to output the timing signal having the expected duty cycle comprises controlling which tap signal is selected and which fine delay is added to the selected one of the tap signals to produce a coarse-plus-fine delay signal that drives the output driver to produce the timing signal.

4. The method of claim 3, further comprising repeating the controlling, the filtering, the converting, the comparing, and the performing, for each of a plurality of different expected duty cycles, to thereby determine errors associated with each of the coarse delay elements and each of the fine delay elements.

5. The method of claim 3, further comprising repeating the controlling, the filtering, the converting, the comparing, and the performing, for each of a plurality of different expected duty cycles, to thereby fill in cells of the calibration table.

6. The method of claim 1, wherein the using the calibration table comprises using the calibration table to calibrate the timing generator.

7. The method of claim 1, wherein the using the calibration table comprises using the calibration table to calibrate a measurement made using the timing generator.

8. The method of claim 1, wherein the timing generator has one or more further output drivers at each of which a respective further timing signal having timing pulses is output, and wherein the controlling, the filtering, the converting, the comparing, and the performing, are also performed for each of the one or more further timing signals output by the one or more further output drivers of the timing generator.

9. The method of claim 8, further comprising, for each one of the output drivers of the timing generator, repeating the controlling, the filtering, the converting, the comparing, the determining and the filling, for each of a plurality of different expected duty cycles.

10. A subsystem for use with a timing generator having an output driver at which a timing signal having timing pulses is output, the subsystem comprising:
an RC filter that filters a timing signal having an expected duty cycle, which is output by the output driver, to produce a DC voltage having a magnitude indicative of an actual duty cycle of the timing signal; and
an analog-to-digital (ADC) that is coupled to the RC filter and converts the DC voltage, which is produced by the RC filter and has the magnitude indicative of the actual duty cycle of the timing signal, to a digital value indicative of the actual duty cycle of the timing signal;
a memory that stores a calibration table that can be used to at least one of calibrate the timing generator or calibrate a measurement made using the timing generator;
a controller that controls the timing generator to modify the timing signal to have each of a plurality of different expected duty cycles, so that the RC filter and the ADC collectively produce a respective different digital value indicative of the actual duty cycle of the timing signal, for each of the different expected duty cycles;
wherein the controller, for each of the plurality of different expected duty cycles, compares the digital value indicative of the actual duty cycle of the timing signal to an expected value corresponding to the expected duty cycle, and determines an error associated with the timing generator in dependence on results of the comparison;
wherein the controller fills in a plurality of cells of the calibration table in dependence on the determined errors; and
wherein the calibration table is used to at least one of calibrate the timing generator or calibrate a measurement made using the timing generator.

11. The subsystem of claim 10, wherein in response to the timing generator being controlled to modify the timing signal to have each of a plurality of different expected duty cycles, the RC filter and the ADC collectively produce a respective different digital value, for each of the different expected duty cycles, indicative of the actual duty cycle of the timing signal.

12. The subsystem of claim 11, wherein the memory stores at least one of:
the digital values produced by ADC for the plurality of different expected duty cycles; or
error values indicative of differences between expected values associated with the plurality of different duty cycles and respective digital values produced by the ADC in response to the timing signal being provided to the RC filter.

13. The subsystem of claim 11, wherein the digital values or the error values are stored in the calibration table in the memory.

14. The subsystem of claim 11, wherein the subsystem is connectable to or part of a TOF measurement system.

15. A system comprising:
a controller;
a timing generator controlled by the controller to produce a timing signal, which over time, is modified to have each of a plurality of different expected duty cycles;
an RC filter that filters the timing signal having expected duty cycles to produce DC voltages having magnitudes indicative of actual duty cycles of the timing signal; and
an analog-to-digital (ADC) that converts the DC voltages, which are produced by the RC filter and have the magnitudes indicative of the actual duty cycles of the timing signal, to digital values indicative of the actual duty cycles of the timing signal;
a memory configured to store a calibration table that can be used to at least one of calibrate the timing generator or calibrate a measurement made using the timing generator;
wherein the controller is configured to:
control the timing generator to modify the timing signal to have each of a plurality of different expected duty cycles, so that the RC filter and the ADC collectively produce a respective different digital value indicative of the actual duty cycle of the timing signal, for each of the different expected duty cycles;
compare the digital value indicative of the actual duty cycle of the timing signal to an expected value corresponding to the expected duty cycle, and determines an error associated with the timing generator in dependence on results of the comparison, for each of the plurality of different expected duty cycles; and
store, within the calibration table stored in the memory, error values indicative of differences between expected values associated with the plurality of different duty cycles and respective digital values produced by the ADC in response to the timing signal being provided to the RC filter; and
wherein the calibration table is used to at least one of calibrate the timing generator or calibrate a measurement made using the timing generator.

16. The system of claim 15, wherein the timing generator comprises:
a tapped delay line including a plurality of coarse delay elements connected in series, the tapped delay line used to produce a plurality of different tap signals, each of which is delayed by a different amount relative to a clock (CLK) signal that drives the tapped delay line; and
a fine delay circuit including a plurality of fine delay elements, the fine delay circuit used to provide a plurality of different fine delays that can be added to a selected one of the tap signals to produce a coarse-plus-fine delay signal that drives an output driver of the timing generator to produce the timing signal;
wherein the controller controls which one of the tap signals is selected and which fine delay is added to the selected one of the tap signals to produce a coarse-plus-fine delay signal that drives an output driver of the timing generator to produce the timing signal.

17. The system of claim 16, wherein the system further comprises a light source and a light detector and the system is adapted to produce time-of-flight (TOF) measurements in dependence how long it takes pulses of light, emitted by the light source, to reflect off an object and be detected by the light detector, and wherein the timing signal comprises a light timing signal that is used to produce a light drive signal that drives the light source or a shutter timing signal that is used to produce a shutter drive signal that is used to drive the light detector.

18. The system of claim 17, wherein the system is configured to use the calibration table to modify the TOF measurements, to increase accuracy of the TOF measurements, by taking into account errors that are due to the timing generator.

19. The system of claim 16, wherein the controller is configured to use the calibration table to select which coarse and fine codes are used to achieve a specific timing signal.

20. The system of claim 16, wherein the controller maps different instances of the timing signal to different combinations of coarse and fine codes.

* * * * *